US008339279B2

(12) United States Patent
Chakravorti et al.

(10) Patent No.: US 8,339,279 B2
(45) Date of Patent: Dec. 25, 2012

(54) REMOTE MONITORING SYSTEM

(75) Inventors: Sivaji Chakravorti, Kolkata (IN);
Biswendu Chatterjee, Kolkata (IN);
Debangshu Dey, Kolkata (IN)

(73) Assignee: Jadavpur University, Kolkata (IN)

( * ) Notice: Subject to any disclaimer, the term of this patent is extended or adjusted under 35 U.S.C. 154(b) by 586 days.

(21) Appl. No.: 12/568,000

(22) Filed: Sep. 28, 2009

(65) Prior Publication Data
US 2011/0037613 A1 Feb. 17, 2011

(30) Foreign Application Priority Data

Aug. 14, 2009 (IN) ........................... 1065/KOL/2009

(51) Int. Cl.
*G08C 19/22* (2006.01)
*H04Q 9/00* (2006.01)
(52) U.S. Cl. .......... 340/870.07; 340/539.26; 340/539.22
(58) Field of Classification Search ............. 340/870.07, 340/539.22, 539.24, 539.21, 539.26
See application file for complete search history.

(56) References Cited

U.S. PATENT DOCUMENTS

| 3,312,895 | A | 4/1967 | Garbuny |
| 7,209,804 | B2 | 4/2007 | Curt et al. |
| 7,295,133 | B1 | 11/2007 | McCollough, Jr. |
| 7,808,400 | B2 * | 10/2010 | McCollough ............ 340/870.07 |
| 7,868,755 | B2 * | 1/2011 | Hanai et al. ............. 340/539.22 |
| 8,185,356 | B2 * | 5/2012 | Mukaigawa et al. ......... 702/188 |
| 2004/0239523 | A1 | 12/2004 | Paoli et al. |
| 2010/0131215 | A1 * | 5/2010 | Kim .............................. 702/58 |

OTHER PUBLICATIONS

International Search Report and Written Opinion for PCT International Application No. PCT/IB2010/001976 mailed Dec. 9, 2010.

* cited by examiner

*Primary Examiner* — Peguy Jean Pierre
(74) *Attorney, Agent, or Firm* — Brundidge & Stanger, P.C.

(57) ABSTRACT

A remote monitoring system provides a real-time monitoring of conditions of an apparatus, such as a power line. The remote monitoring system includes an apparatus that generates electrical signals, a remote monitoring module that is remote from the apparatus, and a transmission module. The transmission module is provided adjacent to the apparatus and transmits data that correspond to the electrical signals via a cellular network to the remote monitoring system. The remote monitoring module receives the signal and determines a condition of the apparatus based on the received electrical signal.

16 Claims, 10 Drawing Sheets

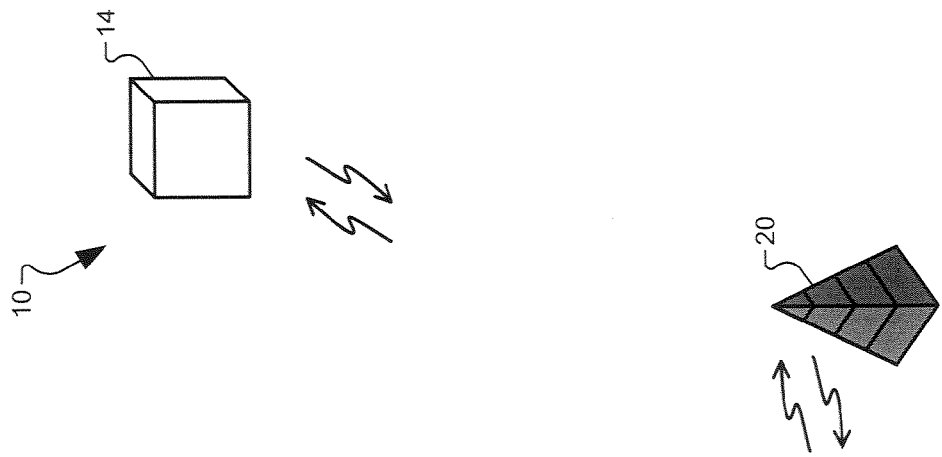
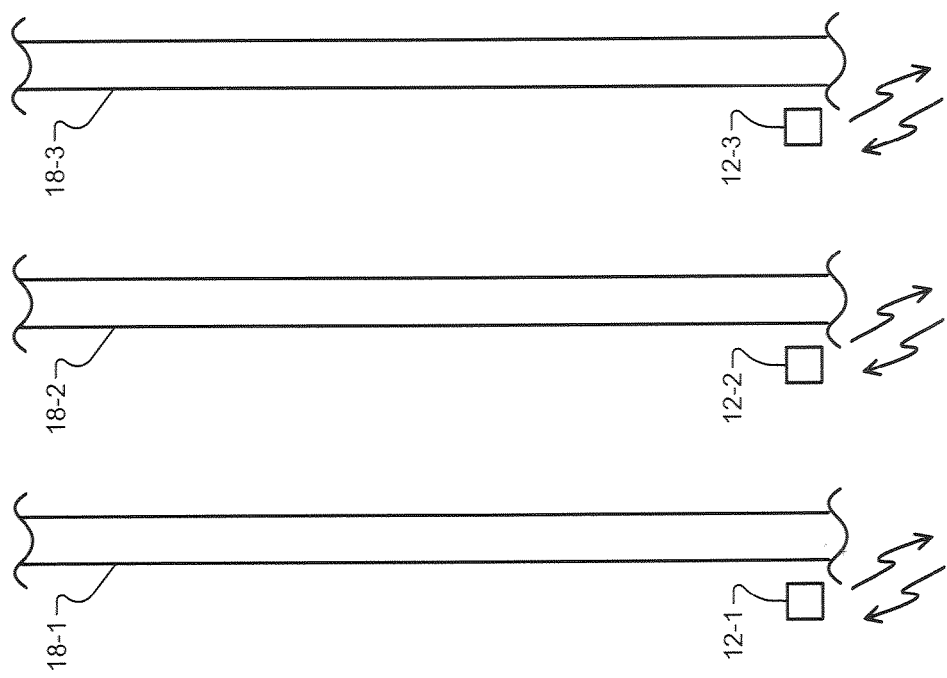
FIG. 1

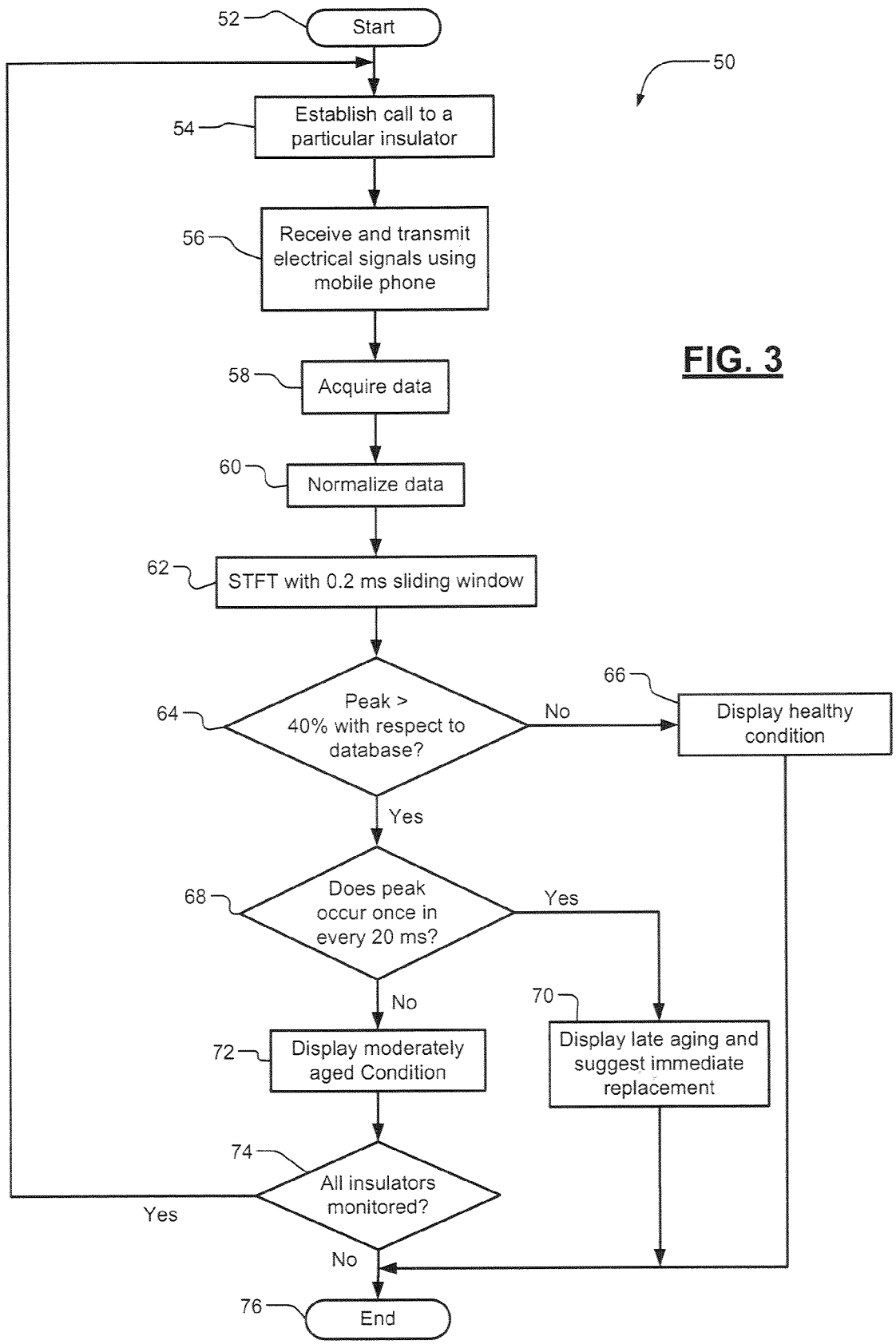

REMOTE MONITORING SYSTEM

CROSS-REFERENCE TO RELATED APPLICATIONS

This application claims the benefit and priority of India Application Serial No. 1065/KOL/2009, filed Aug. 14, 2009. The entire disclosure of the above application is incorporated herein by reference.

BACKGROUND

Remote monitoring systems may use direct transmission lines, such as standard telephone lines to transmit signals indicating conditions of a device, equipment, or object to be monitored. Standard telephone lines can transmit a voice frequency from 300 Hz to 3000 Hz. To monitor and transmit signals outside this range using the standard telephone lines, special means are incorporated to convert the signals and transmit the converted signals via the telephone lines. Upon receipt of the converted signals, the converted signals are converted back for further analysis. Due to the bandwidth limitation of the normal telephony, the signals received may be different from those of the original transmitted pattern. Furthermore, the direct transmission of data using these lines is cost prohibitive in many circumstances as the location of the device may be in remote locations. Moreover, the direct telephone lines may require servicing, as the lines may be damaged by weather or the passage of time. Because of such degradation, the conditions of the device, equipment or object may not be accurately monitored.

An alternative means of monitoring devices is manual inspection. Manual inspection requires a person to physically visit the location of the device being monitored. For example, when monitoring the condition of power lines, or components thereof, such as insulators, the person monitoring the condition must visit each insulator individually. As the cost of a man hour increases, monitoring the status of remotely located devices will also increase.

Thus, there exists a need for a remote monitoring system which does not require direct telephone lines connected to a device being monitored and does not require a person to visit the site of the device to monitor the condition of the device.

SUMMARY

A remote monitoring system of the present disclosure includes an apparatus to be monitored, a receiver and a transmission module. The remote monitoring system includes an apparatus generating an electrical signal indicative of a condition of the apparatus. The system further includes a transmitter that is coupled to the apparatus and that receives the electrical signal from the apparatus and transmitting the electrical signal to the receiver via a cellular network. The system further comprises a remote monitoring module that receives the electrical signal from the transmitter and determines a condition of the apparatus based on the received electrical signal.

In another embodiment, a remote monitoring system for monitoring a condition of a device having an electrical signal associated therewith is described herein. The monitoring system includes a transmission module coupled to the device and receiving the electrical signal from the device. The transmission module includes a circuit which communicates the electrical signal over a cellular network. The monitoring system further includes a remote monitoring module that receives the electrical signal from the cellular network and determines a condition of the device based on the electrical signal.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

FIG. 1 is a schematic diagram of an illustrative embodiment of a remote monitoring system.

FIG. 3 is a flow diagram illustrating an example method for remotely monitoring an apparatus in accordance with the teachings of the present disclosure;

DETAILED DESCRIPTION

Figure 2:
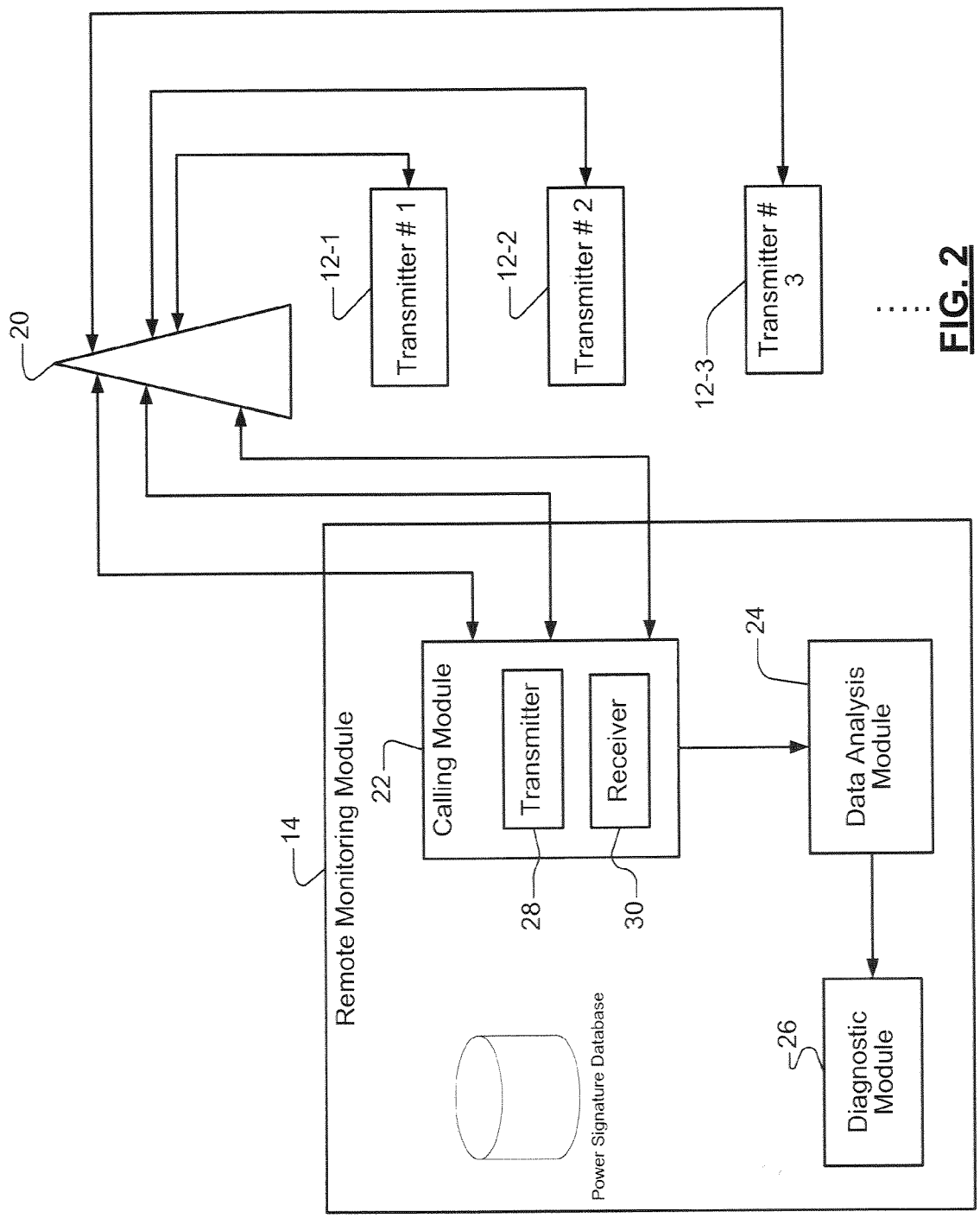
FIG. 2 is a functional block diagram of an illustrative embodiment of a remote monitoring module of a remote monitoring system.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

EXAMPLES

Referring now to FIG. 1, an embodiment of a remote monitoring system 10 includes a plurality of transmission modules 12-1, 12-2, 12-3 and a remote monitoring module 14. The transmission modules 12-1, 12-2, 12-3 are located adjacent to a device, system, equipment, or object to be monitored. The remote monitoring module 14 is provided remote from the device, system, equipment, or object to be monitored.

"Remote" or "remotely" in the present disclosure refers to a positional relationship between the monitoring module 14 relative to the device or object to be monitored and the transmission module 12-1, 12-2, or 12-3.

In the illustrative example of FIG. 1, the remote object to be monitored can include, for example, a plurality of power lines 18-1, 18-2, 18-3 each having an insulator. While three transmission modules 12-1, 12-2, 12-3 and three power lines 18-1, 18-2, and 18-3 are illustrated in FIG. 1, the remote monitoring system 14 may include only one or more transmission modules for monitoring one or more objects. As AC current is delivered in the power lines, power frequency signals are generated at a frequency, typically in the range of 25-60 Hz. The power frequency signals correspond to time series data in an analog electrical waveform. The power frequency signals may be different among different power lines 18-1, 18-2, 18-3 due to different aging conditions of the insulators that surround the power lines 18-1, 18-2 and 18-3. When the insulators age, electric current may leak through the aged insulators at an increased rate, resulting in a change in power signals with respect to frequency and phase. Therefore, the power frequency signals provide an indication of the conditions of the insulators, such as healthy, moderately aged, or late aged.

The transmission modules 12-1, 12-2, 12-3 transmit the analog electrical waveform to the remote monitoring module 14 via cellular transmission. The transmission modules 12-1, 12-2 and 12-3 may include a mobile phone hand set. Other devices that may be used in the transmission modules 12-1, 12-2 and 12-3 include, but are not limited to, a computer having a mobile internet card, a mobile internet device, a citizens band radio, or other devices communicating on a cellular or radio communication network. The cellular transmission may be achieved by an existing cellular network 20 using existing communication protocol. The power frequency signals are sent in real time to the transmission modules 12-1, 12-2, 12-3, which in turn, transmit the power frequency signals to the remote monitoring module 14 via the existing cellular network 20.

The transmission modules 12-1, 12-2, 12-3 may be designed and implemented in such a way that it can be easily incorporated into an existing system (for example, power systems, or medical devices) without major changes in the existing infrastructure or devices. No special hardware is needed to incorporate the mobile phones as transmission modules.

In telecommunications, voice signals are generally received by the microphone of a telephone and converted into analog electrical signals. The analog electrical signals are then transmitted through a telephone or cellular network. In the remote monitoring system 10 of the present disclosure, however, the analog electrical signals from the power lines 18-1, 18-2, 18-3 may be inputted directly to the microphone input of the transmission modules 12-1, 12-2, 12-3 through a coupling circuit. In this regard, it is envisioned amplitude or frequency can be adjusted to allow the signals to be compatible with the cellular network or the transmission module itself. The transmission modules 12-1, 12-3, 12-3, which can be in the form of mobile phones, receive electrical signals, not audio signals. Thus, conversion from voice signals to analog electrical signals is not necessary. The analog electrical signals can be directly received by the microphone input of the transmission modules 12-1, 12-2, 12-3, transmitted via a cellular network, and received by the remote monitoring module 14.

Figure 4A:
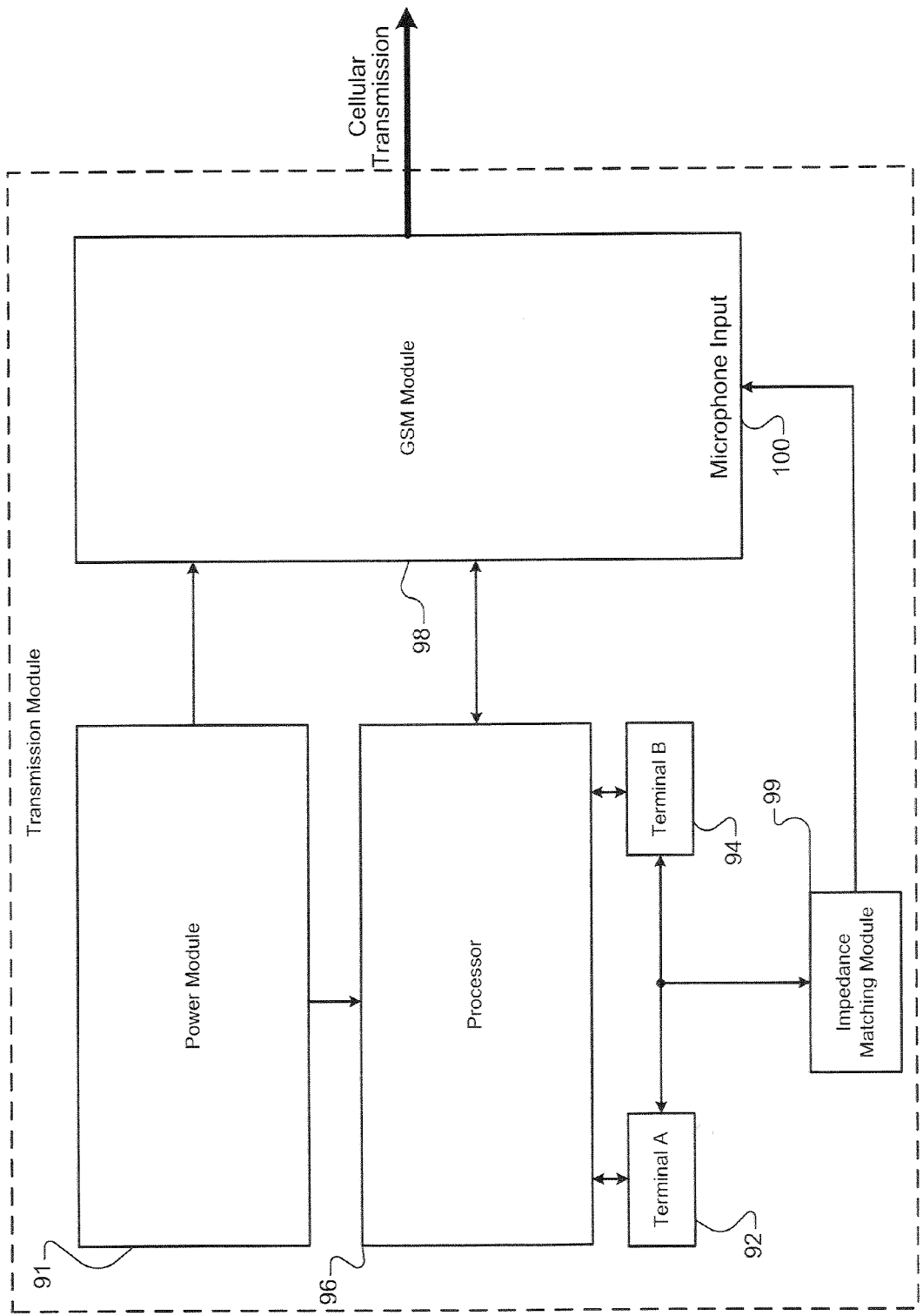
FIG. 4A is a schematic diagram of an example embodiment of a transmission module.
Figure 4B:
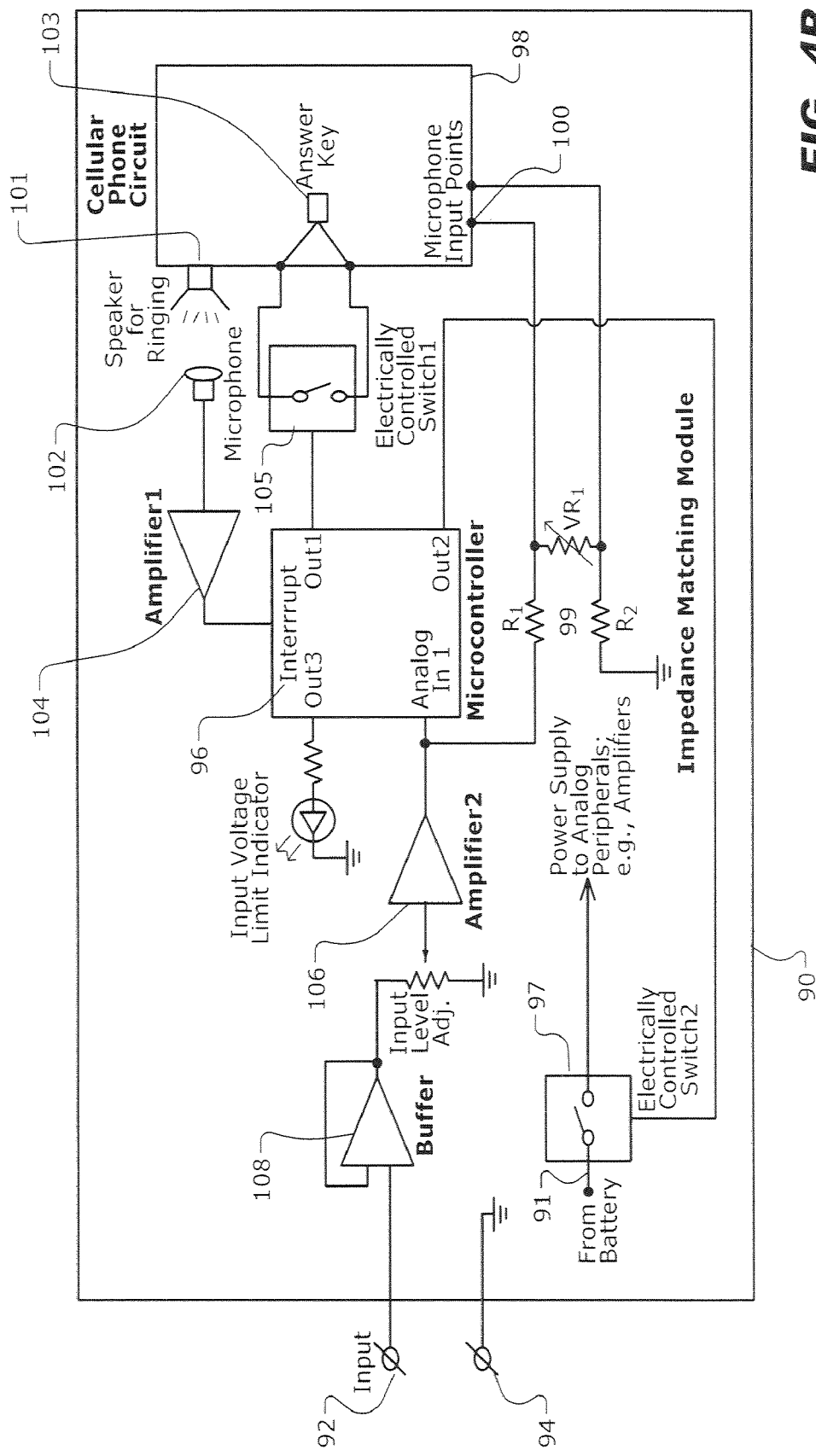
FIG. 4B is a circuit diagram of an example embodiment of a transmission module.

FIG. 4A depicts a schematic of an example transmission module 90. FIG. 4B depicts a circuit diagram corresponding to the schematic of the example transmission module 90. The depicted transmission module 90 includes, a power module 91, a shunt (not shown) having two terminals 92 and 94, a microprocessor 96, an electrically controllable switch 97 (FIG. 4B) that provides electrical power supply from the power module 91 to the peripherals, such as the buffers 108 (FIG. 4B) and the analog amplifiers 104 and 106 (FIG. 4B), a cellular phone 98, and an impedance matching network 99.

The shunt (not shown) sends a voltage signal proportional to the leakage current from the insulators to the terminals 92 and 94 of the transmission module 90. By way of non-limiting example, the shunt may have a resistance of 100Ω and may be located at the back side of the transmission module housing.

In an embodiment, the microprocessor 96 senses a voltage drop across the shunt (not shown) between the two terminals 92 and 94 and activates any needed peripheral circuits. Transmission module 90 also can include a cellular phone 98. For explanatory purposes, the cellular phone can be, but is not limited to, a GSM module. GSM module 98 may be a commercially available low cost GSM phone capable of accepting a particular subscriber identification module (SIM) card for its addressing. Other devices such as computers with mobile wireless cards, CB radios or other half duplex devices may be used. Using GSM modules or other cellular mobile phones provides the capability of long range communications to remote monitoring modules located virtually anywhere on the planet.

In another embodiment, transmission module 90 may also include a power to analog module that receives the power frequency signal in the form of the leakage current and outputs the corresponding analog signal to the GSM module 98. Further, the power to analog module may include an analog buffer-amplifier 108 and 106 (FIG. 4B) that scales a voltage drop observed across the shunt, between terminals 92 and 94, so that the voltage drop does not exceed a predetermined threshold.

As mentioned previously, the GSM module 98 transmits the electric signal. An impedance matching module 99 may receive the analog signal and connect to the microphone input 100 of the GSM module 98, thereby bypassing the microphone 100 of the GSM module 98, which is used to convert a voice signal to an electric signal. The impedance matching module 99 reduces the distortion of the signal by matching the input impedance of the load to the output impedance of the load. At this point, the GSM module 98 may then transmit the signal as if the signal was received from the microphone with a reduced amount of distortion.

Referring now to FIG. 4B, the operation of the example transmission module 90 may be described in greater detail. Microprocessor 96 may normally operate in a power down mode or an idle state. In this state, the electrically controlled switch 97 remains open and power to the peripheral circuits, such as the buffers 108 and analog amplifiers 104 and 106, is cut off. Power to the GSM module 98, however, remains connected, as the GSM module may be required to receive calls from the remote monitoring module 14. When a call is received, the speaker 101 of the GSM module 98 may emit a ring tone, which sensed by a microphone 102 coupled to the microcontroller 96 by means of an amplifier 104. When an electric signal is received by the microcontroller 96 from amplifier 104, the microcontroller 96 exits the power off mode and activates the peripheral circuits.

The peripheral circuits receive power when the microcontroller 96 switches the electrically controlled switch 97. The microcontroller 96 also switches the answer key 103 via another electrically controlled switch 105. It is envisioned that the electrically controlled switches 97 and 103, referenced above, may be small electromechanical switches which consume minute amounts of power, or may be semiconductor devices.

A buffer 108 may be coupled to an amplifier 106, which amplifies the signal received from the shunt, via the buffer 108, and sends the signal to the analog input of the microcontroller 96. The microcontroller 96 may require an analog-to-digital converter so that it may monitor the amplitude of the signal received from the shunt, via the buffer 108.

The signal from the amplifier 106 may also pass through an impedance matching module 99, which connects the output of the amplifier 106 to the microphone input 100 of the GSM module 98. By adjusting $VR_1$, the impedance matching module 99 provides an optimal signal to the microphone input 100. Once received by the microphone input 100, the signal may be transmitted by GSM module 98 over the cellular network. After a predetermined time interval, the microcontroller 96 can open switch 97 and the peripheral circuits may return to a powerless state. Also, remote monitoring module 14 may terminate the connection with GSM module 98. The foregoing was provided as an example of how an example transmission module 90 operates, and was in no way intended to limit the scope of the invention.

Figure 5:
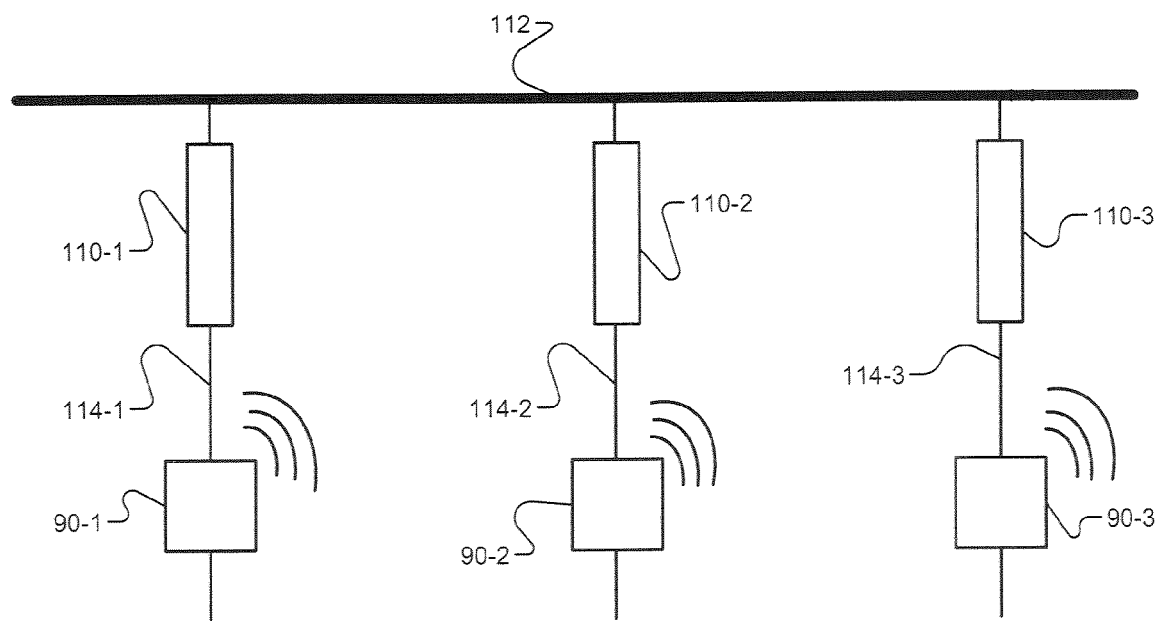
FIG. 5 is an example arrangement of transmission modules with respect to insulators being monitored.

FIG. 5 depicts an exemplary arrangement of transmission module 90-1, 90-2 and 90-3 in relation to insulators 110-1, 110-2, and 110-3 under monitoring. A high voltage power line 112 is coupled to insulators 110-1, 110-2, and 110-3. As can be appreciated, grounds 114-1, 114-2, and 114-3 extend from the insulators 110-1, 110-2, and 110-3. The shunts of each transmission module 90-1, 90-2 and 90-3 are coupled to the ground wire of the corresponding insulator.

Referring back to FIG. 1, transmitting devices 12-1, 12-2, 12-3 transmit the signal via the cellular network 20.

The remote monitoring module 14 receives and processes the signals received from the transmission modules 12-1, 12-2, 12-3 via the cellular network 20. The remote monitoring module 14 may include at least one of a computer, a land phone, a network, a cellular phone, and a display device. The signal may be received from the cellular network 20 by the land phone or cellular phone. A cable connecting the receiver of the telephone can connect to a microphone input jack of the computer. The remote monitoring module 14 may implement algorithms for receiving, analyzing data signals from the cellular network 20 and displaying the results of the analysis. The remote monitoring module 14 may include a commercially available low-cost computer. Therefore, it is easy to incorporate the remote monitoring module 14 into the remote monitoring system 10 of the present disclosure.

Referring to FIG. 2, the remote monitoring module 14 may include a calling module 22, a data analysis module 24, and a diagnostic module 26. The calling module 22 can include a transmitter 28 and a receiver 30. Alternatively, the calling module 22 may include a transceiver (not shown). The calling module 22 establishes a call to a particular device, equipment, or object to be monitored via the transmitter 28. For example, each of the power lines 18-1, 18-2, 18-3 may be designated with a particular telephone number. When the calling module 22 calls the number associated with a particular power line, the transmission module 12-1, 12-2, or 12-3 associated with the particular power line is activated, so as to receive electrical signals from the particular power line. The electrical signals are inputted to the microphone input of the transmission module 12-1, 12-2 or 12-3 associated with the particular power line and transmitted to the receiver 30 of the calling module 22 via the cellular network 20. When the receiver 30 of the calling module 22 receives the data signals from the cellular network 20, the transmitted signals may be communicated to the data analysis module 24 for analysis.

The calling module 22 may be configured to establish a call and to monitor the conditions of the power lines 18-1, 18-2, 18-3 at a regular interval. Alternatively, the calling module 22 may be configured to continuously send a signal to the transmission modules 12-1, 12-2, 12-3 to enable the transmission modules 12-1, 12-2, and 12-3 to receive continuous time-series signals. The calling module 22 may include a telephone or a cellular phone.

The diagnostic module 26 may include a power signature database 32 that includes data indicative of normal and abnormal conditions. For example, the diagnostic module 26 may include data indicating a healthy insulator, a moderately aged insulator, and a late-aged insulator. The data may be obtained via training sessions based on experiments on three categories of artificially aged insulators, classified as healthy, moderately aged and late aged insulator groups. The signals associated with the artificially aged insulators may be stored as signatures of varying insulator conditions. By comparing the received signals with the database 32, the diagnostic module 26 may determine whether the insulator is healthy, moderately aged or late-aged. When the diagnostic module 26 determines that one of the insulators 18-1, 18-2, and 18-3 is late aged and needs to be replaced, the diagnostic module 26 may generate a warning signal to alert a user of the diminished insulator condition.

The data analysis module 24 may implement an algorithm for processing the signals. Upon receipt of the data signals, the algorithm extracts significant features from the received signals and analyzes the signals. For example, the data analysis module 24 may include a short-time Fourier transform (STFT) calculator to transform the radio frequency signals and phase content of the signals. The SIFT may be set to have a 0.2 msec sliding window. As a non-limiting example, when the peak of the coefficient value of the STFT is not greater than 40% with respect to the power signatures in power signature database 32, the diagnostic module 26 may determine that the insulator is in a healthy condition. When the peak of the coefficient value of the SIFT is greater than 40% with respect to the database and the peak does not occur once in every 20 msec, the diagnostic module 26 may determine that the insulator is in a moderately-aged condition. When the peak is greater than 40% with respect to the database and the peak occurs at least once in every 20 msec, the diagnostic module 26 may determine that the insulator is in a late-aged condition.

Referring to FIG. 3, a method 50 of monitoring a remote apparatus, device, system, equipment or object starts at step 52. The remote monitoring module 14 may establish a call to a particular insulator at step 54. The transmission module (i.e., mobile phone) associated with the particular insulator is activated to receive and transmit analog electrical signals via the cellular network at step 56. The remote monitoring module 14 acquires the electrical signals that correspond to conditions of the insulator at step 58. The remote monitoring module 14 normalizes data at step 60. SIFT may be used to transform the radio frequency and phase content of local sections of a signal as it changes over time at step 62. The SIFT may have a 0.2 msec sliding window. At step 64, the method determines whether the peak of the coefficient value of the short-time Fourier transform is greater than 40% with respect to the database 32. When the peak is not greater than 40%, the remote monitoring module 14 determines that the insulator is in a healthy condition, at step 66. When the peak is greater than 40% with respect to database, at step 64, the method 50 proceeds to step 68. At step 68, the remote monitoring module 14 determines whether peak occurs once in every 20 msec. If peak does occur at least once every 20 msec, the remote monitoring module 14 displays a late aging condition and suggests immediate replacement at step 70. If not, the remote monitoring module 14 displays a moderately aged condition at step 72. When insulators to be monitored remain, at step 74, the method 50 iterates back to step 54 to repeat steps 54-74 until all the insulators are monitored. The method ends at step 76.

Although the foregoing provides one method of diagnosing the status of the insulators, other methods may be used. For example, known pattern matching techniques may be used to match the received signal to the signals in power signature database 32. Supervised or unsupervised clustering algorithms are but one example of pattern matching algorithms that may be implemented in data analysis module 26.

Figure 6:
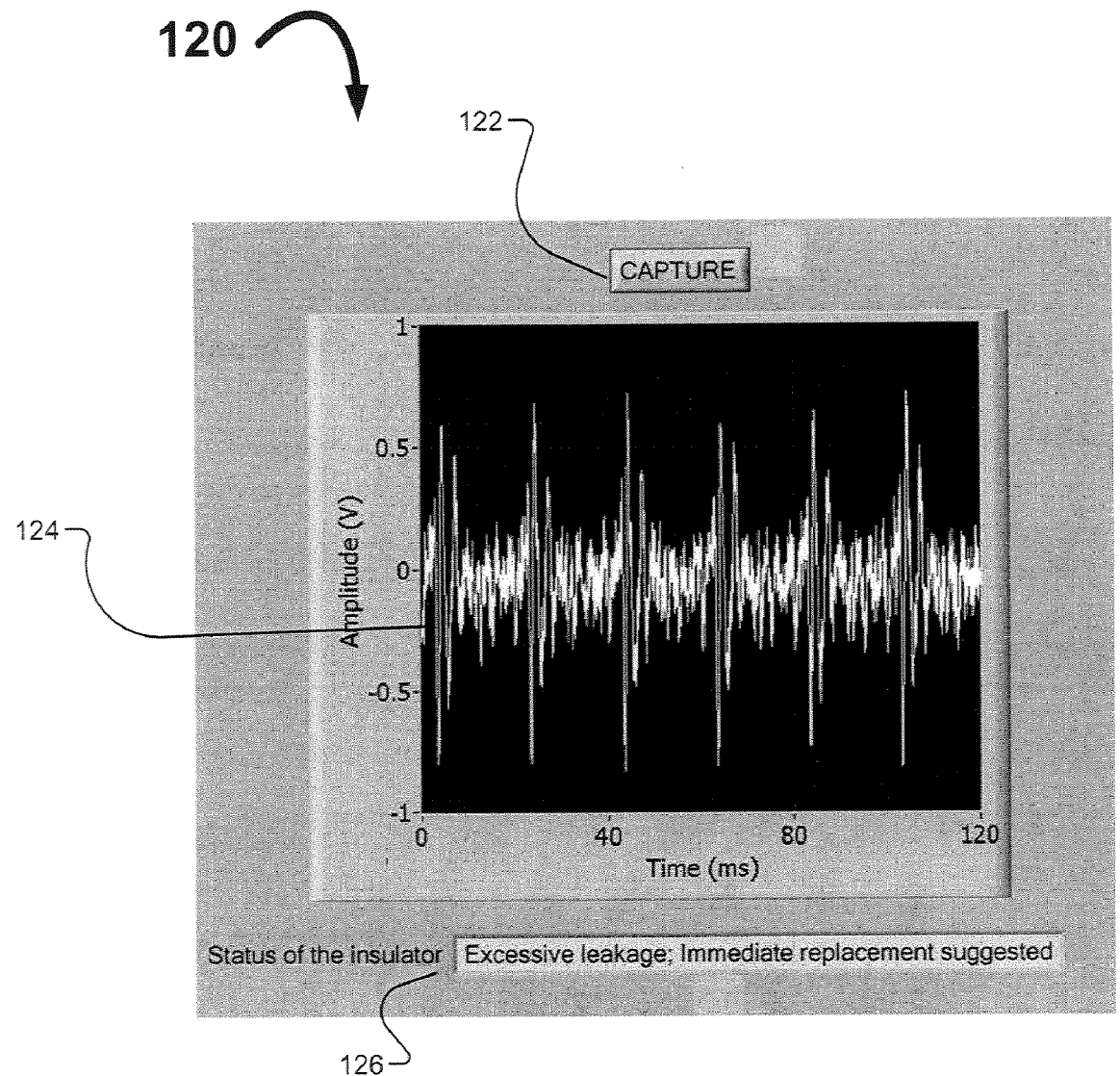
FIG. 6 is an illustration of an example user interface displayed on a display at a remote monitoring module.

As previously mentioned, remote monitoring module 14 may include a display device. The display device may display a graphical user interface. FIG. 6 illustrates an example of a user interface 120 that includes a capture command button 122, a depiction of the received data signal 124, and a field for a diagnosis 126. Upon connecting to the transmission module 12-1, 12-2 and 12-3, remote monitoring module 14 will receive signals from said transmission devices 12-1, 12-2 and 12-3, which may in turn be displayed on the display in a manner similar to an oscilloscope. The user may click on the capture button 122 so that the received signal is stored in the power signature database 32. After running the algorithms described above, a diagnosis of the insulator may be provided in the field for diagnosis 126.

The following describes test results associated with an exemplary embodiment of the remote monitoring system. Three different types of insulators were used for the experiment. In describing the insulators, they are referred to categorically as healthy, moderately aged, and late aged insulators.

From the remote monitoring module 14, the transmission module, as shown in FIG. 5 can be communicated as described previously. At the other end, the insulator is subjected to normal operating voltage of 11 kV. Leakage current that flows from the insulator to the ground creates a voltage drop across the shunt connected with the transmission module 90. Whenever the connection is established, the addressed transmission module 90 becomes active. Voltage drop across the shunt is suitably scaled and sent to the microphone input 100 of the GSM module 98. After transmission over the cellular network, at the remote monitoring module 14 end, this data is captured. The healthy, moderately aged and late aged insulators were placed in the position of the insulator in the setup shown in FIG. 5. Data from each case were obtained by capturing the signal at the remote monitoring module 14.

Figure 7A:
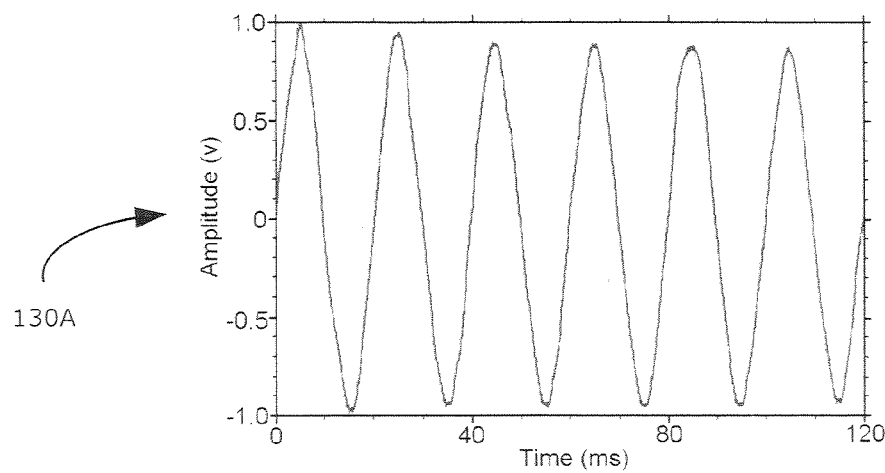
FIGS. 7A, B and C are graphs illustrating voltage signals as obtained from the leakage currents of healthy insulators, moderate aging insulators and late aging insulators, respectively.
Figure 7B:
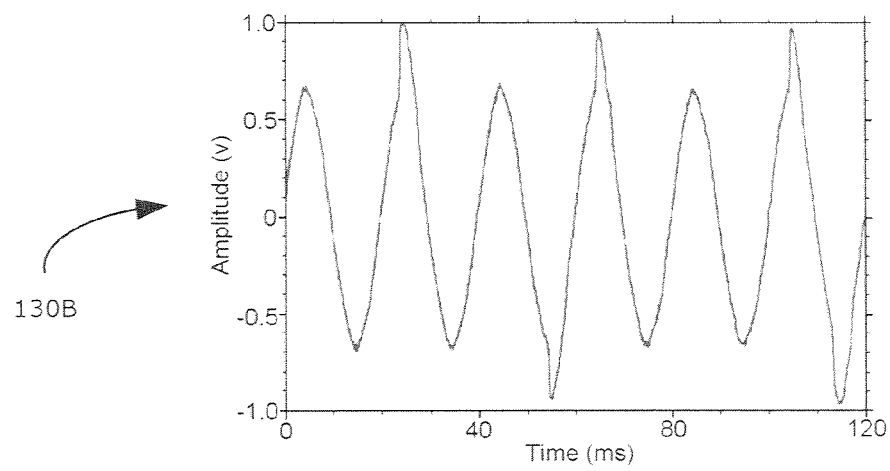
Figure 7C:
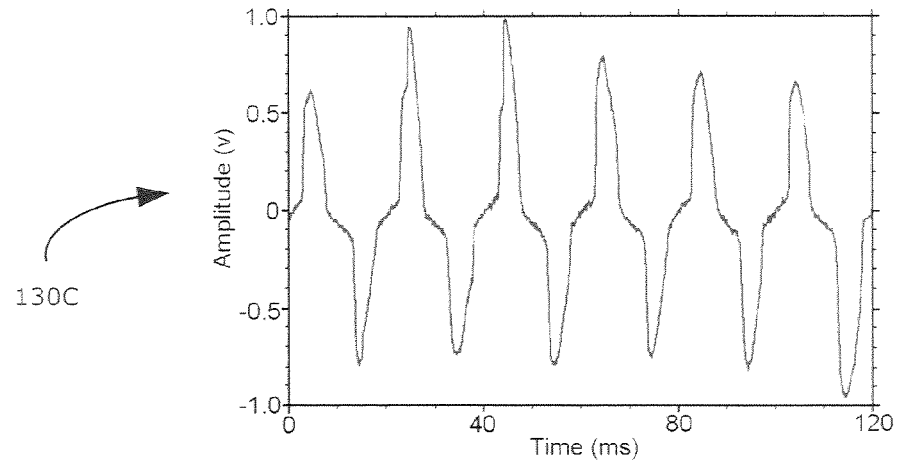

FIGS. 7A, 7B and 7C show the normalized voltage signals as obtained across the shunt connected with the three categories of insulator in the experimental setup as depicted in FIG. 5. FIG. 7A is a time-series graph 120A of a healthy insulator, FIG. 7B is a time-series graph 120B of a moderate aged insulator and FIG. 7C is a time-series graph 120C of a late aging insulator. These three signals are distinctly different and can be easily identified.

Figure 8A:
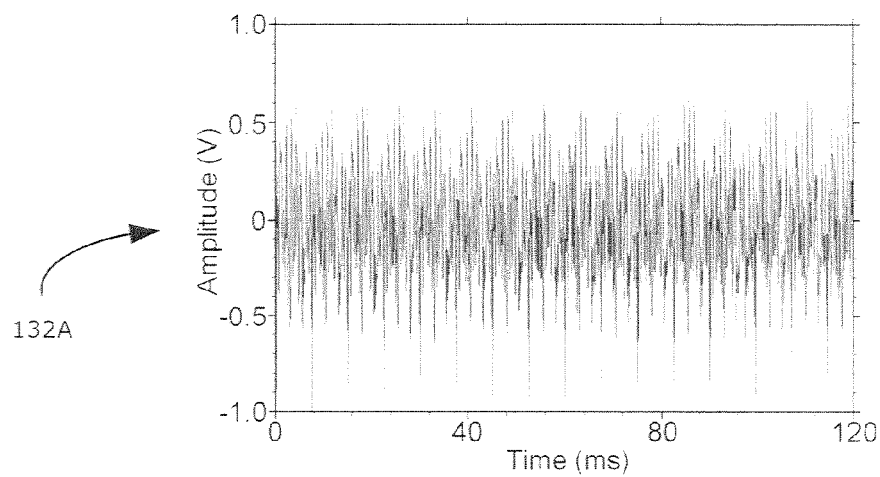
FIGS. 8A, B and C are graphs illustrating normalized voltage signals as obtained from the leakage currents of healthy insulators, moderate aging insulators and late aging insulators, respectively.
Figure 8B:
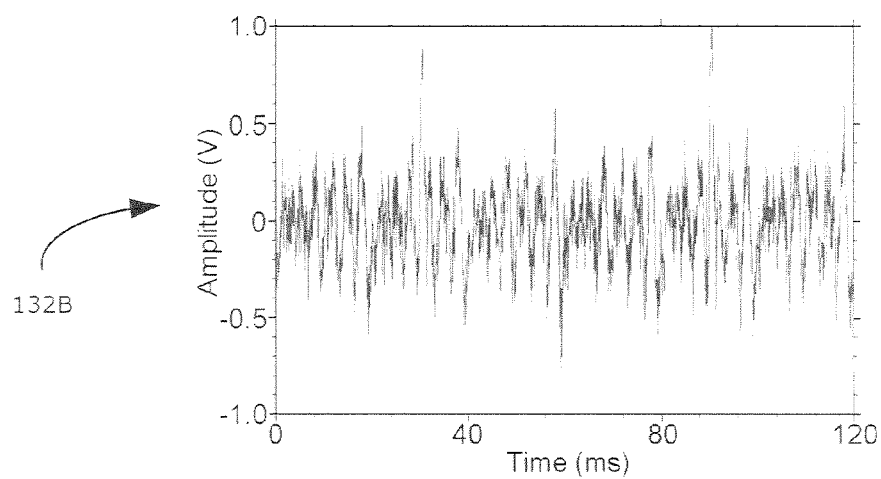
Figure 8C:
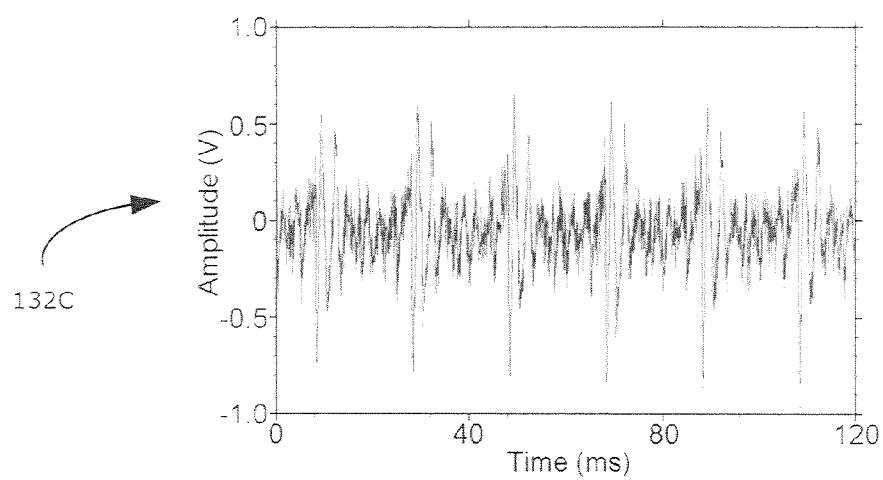

FIGS. 8A, 8B and 8C show the same signals corresponding to FIGS. 7A, 7B and 7C after reception through the cellular network in the remote monitoring module 14. The results show how the nature of the data varied when received at the terminal end in the computer.

As depicted in FIG. 6, the user-interface at the remote monitoring module 14 can show the status of the insulator according to the results received. This determination can be made because the waveform displayed is not a direct reflection of the nature of the signal that is present across the shunt. Based on the available data, status is displayed. Since the data obtained at the terminal-end is different than that across the shunt, a suitable approach is taken to estimate the amount of deviation of the obtained data with respect to the healthy insulator, which is taken as reference.

Figure 9A:
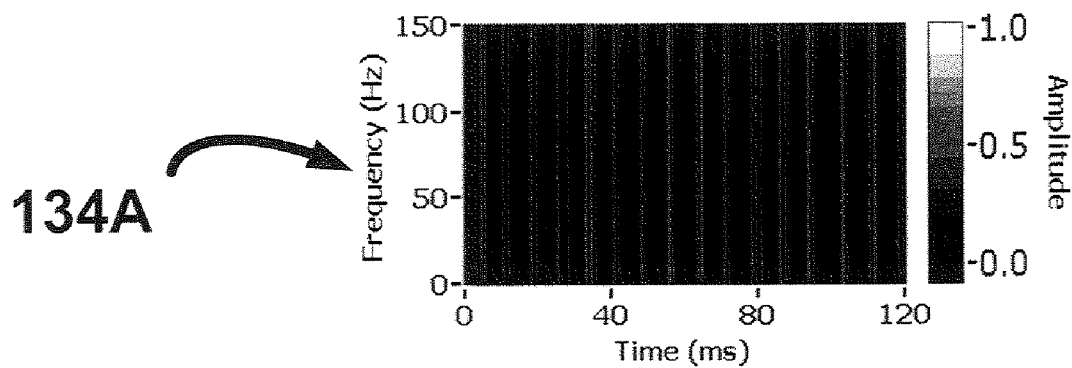
FIGS. 9A, B and C are graphs illustrating frequency spectrums of the normalized voltage signals as obtained from the leakage currents of healthy insulators, moderate aging insulators and late aging insulators, respectively.
Figure 9B:
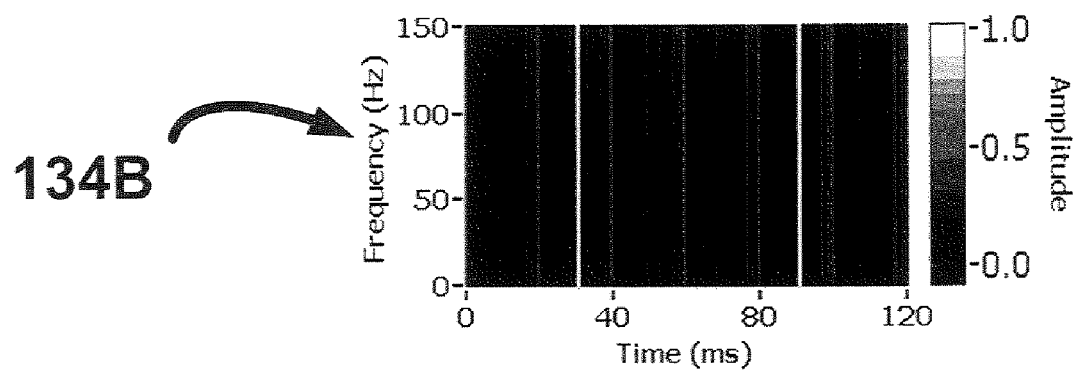
Figure 9C:
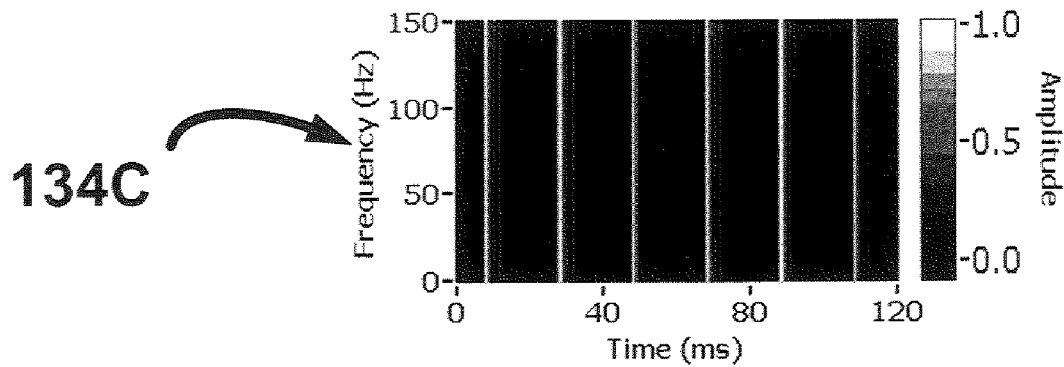
Figure 4B:
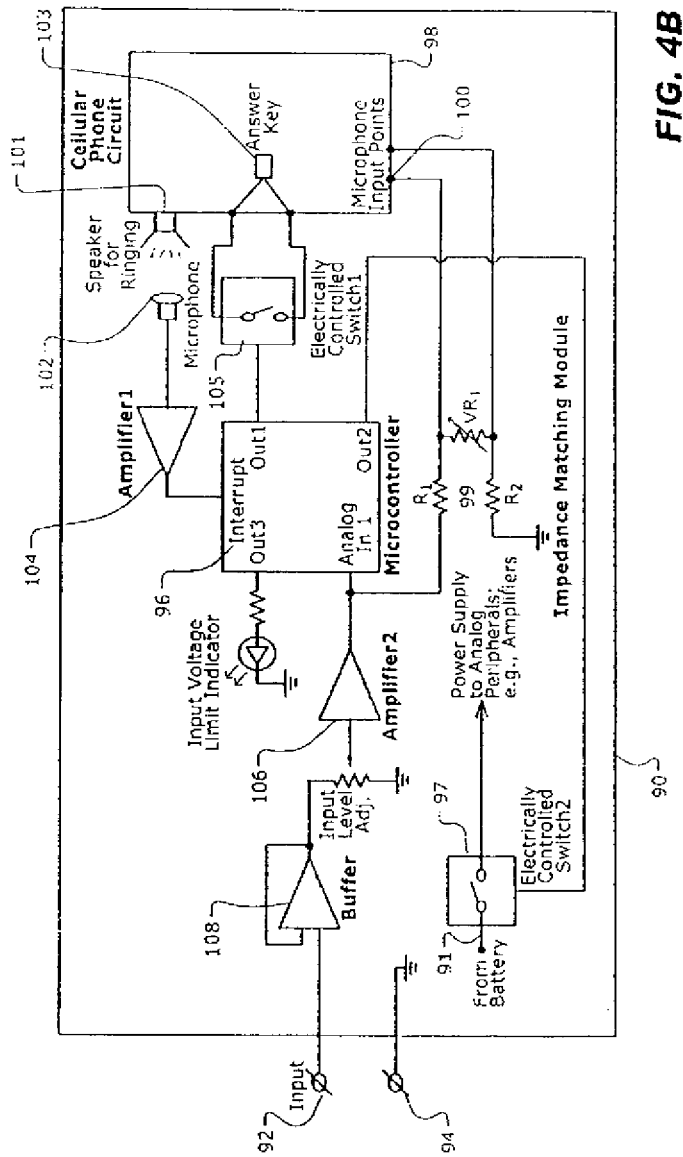

To estimate this distortion, the data of the normalized signal from the insulators having six power frequency cycles is passed through a Short Time Fourier Transform (STFT) within a sliding window width of 0.2 ms. The results are shown in FIGS. 9A, 9B and 9C. In the case of healthy insulator, FIG. 9A represents the spectrum from data of FIG. 8A, FIG. 9B represents the spectrum from data of FIG. 8B, and FIG. 9C represents the spectrum from data of FIG. 8C, respectively.

Considering the frequency range, as shown in FIGS. 9A, 9B and 9C, it is observed that the peaks obtained are at least 40% greater in the cases of moderate and late aging insulators compared to those of a healthy insulator within the duration of 120 ms. Comparison of the results for moderate aging insulators with that for the healthy insulator shows that the peak is present twice in the duration of 120 ms. It is envisioned other time intervals may be used as ell. As shown in the spectra of FIG. 9C, in the case of late aging insulators, where the distortion is much more compared to a sine wave, one high peak is always present in the interval of 20 ms. From these results the interpretation of the condition of insulator may be performed.

In some embodiments, an analog power frequency condition monitoring signal is directly transmitted to the microphone input of the mobile phone. The continuously time-varying electrical signal in real time may be transmitted via a mobile phone using the common mobile communication transmission protocols.

An operating personnel may monitor and analyze an apparatus, a device, equipment or an object in real time from a remote place. The remote monitoring module 14 may be a centralized condition monitoring scheme for equipments in an electrical power grid both at the state level and the national level. The transmission modules 12-1, 12-2, 12-3 may be placed in different places to monitor different objects, such as high voltage insulators and transformers etc.

In other embodiments, the remote monitoring system 10 can be used to monitor devices other than insulators of power lines, such as, by way of non-limiting examples, a transformer, a chemical processor, medical devices. For example, signals such as electrocardiography (ECG), and electroencephalography (EEG) are commonly used in medical fields to monitor the activity of a heart, or a brain's spontaneous electrical activity. A transmission module 14 may be incorporated into the medical monitoring device that receives the ECG or EEG signals. A doctor or nurse may place a call to the mobile phone associated with the medical monitoring device to retrieve ECG or EEG. Therefore, the doctor or nurse can monitor the condition of a patient in a remote place, such as a moving ambulance or a cabin in the woods, without an internet connection. Also, the transmission module 90 may be configured to periodically transmit ECG or EEG signals to a remote monitoring module 14 without having to receive a call from the remote monitoring module 14. Alternatively, the transmission module 90 may transmit the signals to a remote monitoring module when the frequency or amplitude of the signal exceeds a predetermined threshold.

The remote monitoring system 10 may also be configured to receive meter readings from water meters, electricity meters, gas meters and the like. This ready reduces the amount of man hours required to collect meter readings.

In the alternative applications provided above, the hardware described in the preceding description would require minimal changes. As all of the alternative applications are directed to devices which output electrical signals, the output of those electrical signals would be connected to the microphone input of the GSM module 98, in a manner that is similar to that which was described above.

In addition, in an embodiment the remote monitoring system can identify any intermediate state/gradual change of a condition. Because the data signals may be transmitted continuously in real time over a predetermined period of time, changes in the data signals become easily determined and identified.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functional y.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member.

The invention claimed is:

1. A remote monitoring system for monitoring a condition of an insulator having an electrical signal associated therewith comprising:
   a cellular telephone, coupled to the insulator, that receives the electrical signal from the insulator to a microphone input thereof, wherein the cellular telephone communicates the electrical signal over a cellular network; and
   a remote monitoring module that receives the electrical signal from the cellular network and determines a condition of the insulator based on the electrical signal.

2. The remote monitoring system of claim 1, wherein the remote monitoring module comprises a calling module that initiates a telephone call to the cellular telephone to initiate transmission of the electrical signal.

3. The remote monitoring system of claim 1, wherein the remote monitoring module comprises:
a data analysis module and a power signature database that stores a plurality of power signatures of known electrical signals associated with insulators of varying conditions, receives the electrical signal, and compares the electrical signal with the plurality of power signatures stored in the power signature database to determine the condition of the insulator.

4. The remote monitoring system of claim 3, wherein the data analysis module identifies the received electrical signal as one of a healthy condition, a moderately-aged condition, or a late-aged condition.

5. The remote monitoring system of claim 3, wherein the data analysis module performs a short-time Fourier transform on the received electrical signal to produce a transformed signal and compares the transformed signal with the plurality of power signatures stored in the power signature database.

6. The remote monitoring system of claim 5, further comprising a diagnostic module that determines if a peak of a coefficient value of the transformed signal is not greater than 40% with respect to stored data in the diagnostic module.

7. The remote monitoring system of claim 5, wherein the diagnostic module determines if a peak of the coefficient value of the transformed signal is greater than 40% with respect to stored data in the diagnostic module and if the peak does not occur once every 20 msecs.

8. The remote monitoring system of claim 5, wherein the diagnostic module determines if a peak of the coefficient value of the transformed signal is greater than 40% with respect to stored data in the diagnostic module and if the peak occurs at least once every 20 msec.

9. A method for remote monitoring of a condition of an insulator having an electrical signal associated therewith, the method comprising:
receiving the electrical signal from the insulator by a microphone input of a cellular telephone coupled to the insulator, communicating the electrical signal over a cellular network, the cellular telephone communicating the electrical signal over the cellular network;
receiving the electrical signal from a transmission module by a remote monitoring module via the cellular network; and
determining a condition of the insulator based on the electrical signal received by the cellular telephone.

10. The method of claim 9, further comprising initiating a telephone call to the cellular telephone to initiate the communication of the electrical signal over the cellular network.

11. The method of claim 9, further comprising maintaining a database of a plurality of power signatures of known electrical signals associated with insulators of varying conditions.

12. The method of claim 11, further comprising comparing the electrical signals received by the remote monitoring module with the plurality of power signatures stored in the database to determine the condition of the insulator.

13. The method of claim 12, further comprising identifying insulators associated with the received electrical signal as one of a healthy condition, a moderately-aged condition, or a late-aged condition.

14. The method of claim 12, further comprising:
performing a short-time Fourier transform on the received electrical signal to produce a transformed signal; and
comparing the transformed signal with the plurality of power signatures stored in the database to determine a condition of the insulator associated with the electrical signal.

15. The method of claim 14, further comprising identifying the insulator as being in one of:
a) a healthy condition by which a peak of a coefficient value of the transformed signal is not greater than 40% with respect to the power signatures stored in the database;
b) a moderately-aged condition by which the peak of the coefficient value of the transformed signal is greater than 40% with respect to the power signatures stored in the database and the peak does not occur once every 20 msec; and
c) a late-aged condition by which the peak of the coefficient value of the short-time Fourier transform is greater than 40% with respect to the power signatures stored in the database and the peak occurs at least once every 20 msec.

16. A remote monitoring system for monitoring a condition of an insulator having an electrical signal associated therewith comprising:
a transmission module coupled to the insulator that receives the electrical signal from the insulator, the transmission module including a cellular telephone communicating the electrical signal over a cellular network, wherein the electrical signal is communicated from the insulator to a microphone input of the cellular telephone thereby bypassing the microphone input;
a remote monitoring module that receives the electrical signal from the cellular network and determines a condition of the insulator based on the electrical signal;
a calling module that initiates a telephone call from the remote monitoring module to the cellular telephone of the transmission module thereby initiating transmission of the electrical signal to the remote monitoring module;
a power signature database that stores a plurality of power signatures of known electrical signals associated with insulators of varying conditions; and
a data analysis module that receives the electrical signal communicated via the cellular network to the remote monitoring module, performs a short-time Fourier transform on the received electrical signal to produce a transformed signal, and that compares the transformed signal with the plurality of power signatures stored in the power signature database to determine the condition of the insulator, wherein the insulator is identified as being in one of:
a) healthy condition by which a peak of the coefficient value of the short-time Fourier transform is not greater than 40% with respect to the power signatures stored in the power signature database;
b) moderately-aged condition by which the peak of the coefficient value of the short-time Fourier transform is greater than 40% with respect to the power signatures stored in the power signature database and the peak does not occur once every 20 msec; and
c) a late-aged condition by which the peak of the coefficient value of the short-time Fourier transform is greater than 40% with respect to the power signatures stored in the power signature database and the peak occurs at least once every 20 msec.

* * * * *

UNITED STATES PATENT AND TRADEMARK OFFICE
CERTIFICATE OF CORRECTION

PATENT NO. : 8,339,279 B2
APPLICATION NO. : 12/568000
DATED : December 25, 2012
INVENTOR(S) : Chakravorti et al.

It is certified that error appears in the above-identified patent and that said Letters Patent is hereby corrected as shown below:

In the Drawings

Delete drawing sheet 5, and replace with drawing sheet 5. (Attached)

In the Specification

In Column 2, Line 13, delete "system." and insert -- system; --, therefor.

In Column 6, Line 34, delete "SIFT" and insert -- STFT --, therefor.

In Column 6, Line 40, delete "SIFT" and insert -- STFT --, therefor.

In Column 6, Line 57, delete "SIFT" and insert -- STFT --, therefor.

In Column 6, Line 60, delete "SIFT" and insert -- STFT --, therefor.

In Column 8, Line 25, delete "ell." and insert -- well. --, therefor.

In Column 9, Line 1, delete "ready" and insert -- greatly --, therefor.

In Column 9, Line 28, delete "functional y." and insert -- functionality. --, therefor.

Signed and Sealed this
Eighteenth Day of June, 2013

Teresa Stanek Rea
*Acting Director of the United States Patent and Trademark Office*